United States Patent [19]

Newman

[11] Patent Number: 5,086,329
[45] Date of Patent: Feb. 4, 1992

[54] PLANAR GALLIUM ARSENIDE NPNP MICROWAVE SWITCH

[75] Inventor: Harvey S. Newman, Washington, D.C.

[73] Assignee: The United States of America as represented by the Secretary of the Navy, Washington, D.C.

[21] Appl. No.: 558,540

[22] Filed: Jul. 27, 1990

[51] Int. Cl.$^5$ ............... H01L 29/00; H01L 29/161; H01L 33/00; H01L 31/00
[52] U.S. Cl. ...................................... 357/37; 357/22; 357/16; 357/17; 357/52; 136/255
[58] Field of Search ............... 357/22 H, 37, 22 A, 357/16, 17, 23.2, 52; 136/255

[56] References Cited

U.S. PATENT DOCUMENTS

| | | | |
|---|---|---|---|
| 3,371,213 | 2/1968 | Adams et al. | 250/211 |
| 4,194,935 | 3/1980 | Dingle et al. | 148/175 |
| 4,411,728 | 10/1983 | Sakamoto | 156/606 |
| 4,492,810 | 1/1985 | Ovshinsky et al. | 136/255 |
| 4,675,711 | 4/1987 | Harder et al. | 357/23.2 |
| 4,690,714 | 9/1987 | Li | 437/208 |
| 4,695,857 | 9/1987 | Baba et al. | 357/16 |
| 4,697,197 | 9/1987 | Dresner | 357/23.2 |
| 4,883,770 | 11/1989 | Dohler et al. | 357/16 |
| 4,947,142 | 8/1990 | Tayrani | 357/22 H |

Primary Examiner—Rolf Hille
Assistant Examiner—Wael Fahmy
Attorney, Agent, or Firm—Thomas E. McDonnell; George Jameson

[57] ABSTRACT

A microwave switch is provided for controlling the transmission of microwave energy in a microstrip transmission line structure. The microwave switch comprises an electrically conducting ground plane in contact with one side of an undoped semiconductor material having on its other side a superlattice of gallium arsenide consisting of a periodic sequence of p- and n-doped gallium arsenide layers. P- and n-type regions are formed integral with and electrically connected to the superlattice, and first and second microstrip transmission lines are electrically connected to respective ones of the n- and p-type regions.

22 Claims, 1 Drawing Sheet

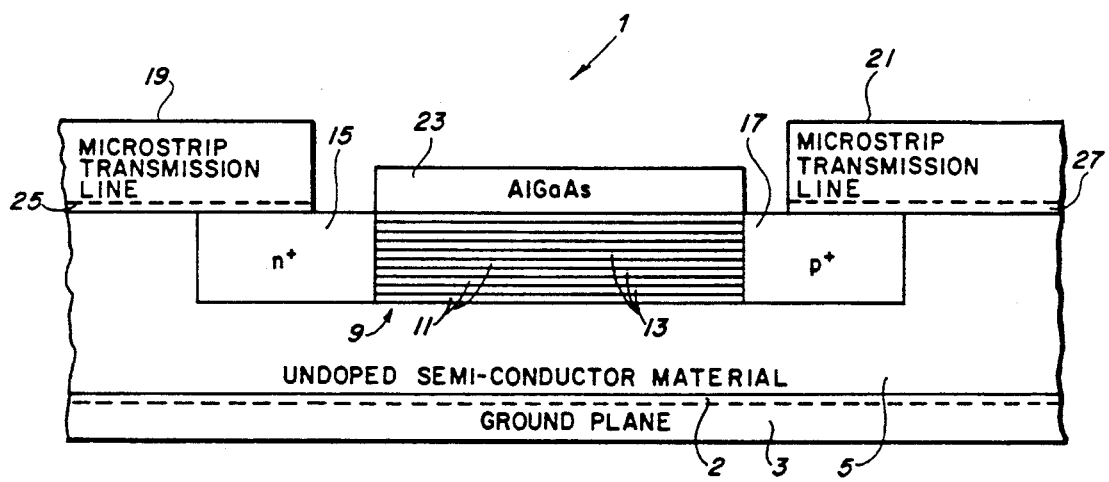
FIGURE

PLANAR GALLIUM ARSENIDE NPNP MICROWAVE SWITCH

BACKGROUND OF THE INVENTION

1. Field of the Invention

The present invention relates in general to a microwave switch for controlling the transmission of microwave energy and a microstrip structure and, more particularly, to a planar solid state switching component which can be used at microwave frequencies and can be manufactured so that it is compatible with other planar monolithic gallium arsenide components.

2. Description of the Prior Art

Components currently in use as microwave switches are fabricated from silicon. These switches have been optimized to exhibit excellent performance characteristics. However, these devices are manufactured as discrete package components which must be inserted in hybrid microwave circuits. There are many current applications for which a microwave switch fabricated monolithically, i.e., on the same semiconductor wafer as the other microwave components in the circuit, would be more economical than if fabricated as a discrete component. Since microwave monolithic integrated circuits are fabricated from gallium arsenide, it is desirable to have a gallium arsenide microwave switch which is compatible with monolithic or planar fabrication processes.

Two different conventional component technologies have provided solutions to the problem of designing monolithic microwave switches. In one such technology, a gallium arsenide metal-semiconductor field effect transistor (MESFET) provides a microwave switch. A MESFET is described in U.S. Pat. No. 4,194,935. In a second technology, a gallium arsenide (GaAs) PIN diode has been formed as a monolithic microwave switch. The MESFET is limited in its power handling ability to about 1–3 watts. The gallium arsenide planar PIN diode can handle much more power but has a poor performance due to its large resistance when switched to the conducting state. This poor performance can be attributed to a fundamental physical property of gallium arsenide: It has an electronic band structure which is direct-gap and, consequently, has a very short excess carrier lifetime. This short lifetime, with the contributing effect of surface recombination due to the planar geometry, results in a degraded on-state resistance for the switch.

One of the basic shortcomings of conventional gallium arsenide microwave planar PIN diodes is that the intrinsic (I) or central region between the p- and n-regions has a relatively short time constant and unsatisfactory switching characteristics, even when the I region is formed of undoped gallium arsenide. Experience has shown that doping the I region of gallium arsenide tends to shorten the time constant even further, resulting in unsatisfactory operational characteristics of the switch.

Optical detectors have used the NIPI superlattice structure between p- and n-materials. The use of such a superlattice in a semiconductor is described in U.S. Pat. No. 4,695,857. U.S. Pat. No. 4,492,810 describes superlattice structures formed of GaAs. U.S. Pat. No. 4,411,728 describes a photodetector having a superlattice of a P-N periodic structure, with n+ impurities diffused or implanted on one of the opposite end faces perpendicular to the p-n junctions interface and a p+ impurity in the other end face. These structures were not, however, used in microwave switching and were designed to be activated optically. A solid state microwave switch is needed for controlling the transmission of microwave energy in a microstrip line structure.

SUMMARY OF THE INVENTION

A microwave switch is provided for controlling the transmission of microwave energy in a microstrip structure. The microwave switch comprises a planar electrically conducting ground plane in contact with one side of an undoped insulating semiconductor material having on its other side a plurality of epitaxially grown layers of a semiconducting material which are alternately doped with different dopants to form alternate p- and n-type layers, the thickness of the layers and the amount of dopants contained therein being balanced to produce a superlattice which is fully compensated and depleted of free-charge carriers. The microwave switch has p- and n-type regions formed integral with the superlattice so that the superlattice electrically connects the p- and n-regions. A microstrip is electrically connected to the p- and n-type regions, and the superlattice has on its last grown layer a passivating layer inhibiting surface recombination.

BRIEF DESCRIPTION OF THE DRAWINGS

Various other objects, features, and attendant advantages of the present invention will be more fully appreciated as the same becomes better understood when considered in conjunction with the accompanying drawings in which like reference characters designate the same or similar parts throughout the several views, and wherein:

The FIGURE is a cross-sectional view of a portion of a microwave switch constructed according to the present invention.

DETAILED DESCRIPTION OF THE PREFERRED EMBODIMENT

According to the present invention, a microwave switch for controlling the transmission of microwave energy can be formed on a wafer of a semi-insulating semiconducting material having on one side a ground plane and on its other side a plurality of epitaxially grown layers of a semiconducting material which are alternately doped with different dopants to form alternate p- and n-type layers. The use of molecular beam epitaxy to grow a doped NIPI superlattice is described in U.S. Pat. No. 4,883,770. The thickness of these layers and the amount of dopants contained therein can be balanced to produce a superlattice which is fully compensated and depleted of free-charge carriers. P- and n-type regions are formed integral with the superlattice so that the superlattice is electrically connected to the p- and n-type regions. The microstrip transmission line can be electrically connected to the p- and n-type regions. To inhibit surface recombination of the superlattice, a passivating layer is formed on the last grown layer of the superlattice.

According to the present invention, as long as the central region of the diode microwave switch of the present invention (the region between the p- and n-type regions) imitates an intrinsic or nearly intrinsic material, then the excess carriers injected under forward bias from the injecting contacts serve to modulate the conductivity and thereby create switching action. To achieve this enhanced performance, it is necessary to adjust the doping intensity and layer thickness so that the central region of the diode will be fully compensated.

By replacing the I region of a gallium arsenide PIN diode with a NIPI superlattice, as described in U.S. Pat. No. 4,883,770, designed such that the NIPI region is fully compensated and fully depleted, the lifetime can be greatly enhanced. The on-resistance ($R_{ON}$) for a small diode, wherein the width of the I region is much smaller than the Debye length will be $$R_{ON} = \frac{w^2}{2\mu I_o \tau}$$

where:
$\tau$ is the excess carrier lifetime,
w is the width of the I region,
$\mu$ is the carrier ambipolar mobility, and
$I_o$ is the forward bias current Since the excess carrier lifetime $\tau$ improves greatly in a NIPI due to carrier confinement, the on-resistance can be reduced, leading to a larger diode, lower capacitance, higher reverse breakdown, and improved performance.

Referring now to the FIGURE, a microwave switch produced according to the present invention is shown generally at 1 and comprises a planar electrically conducting ground plane 3 in contact with one side of an undoped semiconducting material 5 having on its other side a plurality of epitaxially grown layers to form a NIPI superlattice 9. The superlattice 9 is alternately doped with different dopants to form alternate n-type layers 11 and p-type layers 13. The microwave switch 1 has an n-type region 15 and a p-type region 17 formed integral with the superlattice 9 so that the superlattice 9 electrically connects the n- and p-type regions 15 and 17. Microstrip transmission lines 19 and 21 are electrically connected to the n- and p-type regions 15 and 17, respectively. A passivating layer 23 of, for example, AlGaAs, may be grown on the surface of the superlattice 9 to inhibit surface recombination.

In a preferred embodiment of the present invention, a metallic ground plane 3 is formed on one side of an undoped semiconductor material 5. The ground plane 3 is preferably formed of gold or copper, which can be applied to the semiconductor material 5 by any conventional process. For example, the gold or copper ground plane 3 can be deposited on the undoped semiconductor material 5 by vapor deposition or chemical vapor deposition.

To improve adhesion between the ground plane 3 and the undoped semiconductor material 5, a thin layer of chromium 2 can be formed between the conducting ground plane 3 and the undoped insulating dielectric material 5.

In a preferred aspect of the present invention, the undoped semiconductor material 5 can be gallium arsenide or indium phosphide, which is preferably formed as a wafer. Gallium arsenide wafers or chips are well known in semiconductor technology, and chips or wafers of these materials prepared by conventional means are suitable for use in connection with the present invention. On the other side of the undoped semiconductor material 5 is grown, preferably by means of molecular beam epitaxy, many thin layers of doped epitaxial gallium arsenide. The thin layers are formed with alternating donor (n) and acceptor (p) doping such that the product of the layer thickness and the doping concentration of an n-layer is approximately equal to the product of the layer thickness and doping concentration of a p-layer. A description of a process for making such a superlattice of gallium arsenide is described in "The Use of Si and Be Impurities for Novel Periodic Doping Structures in GaAs Grown by Molecular Beam Epitaxy," by K. Ploog et al., J. Electrochem. Soc.: Solid-State Science and Technology, pp. 400–410, February 1981. The thickness of the alternating layers and the amount of dopants contained therein is preferably balanced to produce a superlattice which is fully compensated, i.e., depleted of free-charge carriers. This type of layered heterostructure is conventionally referred to as a doping superlattice or a "NIPI" heterostructure.

Formed on the superlattice structure are spaced n- and p-type regions, which are formed integral with the superlattice so that the superlattice is electrically connected to the n- and p-type regions. Preferably, the n- and p-type regions can be formed by ion implantation or by a combination of etching, metal evaporation, and alloying to injecting contact regions which are heavily doped. Preferably, the n-type region can be formed by doping with silicon or tin, and the p-type region can be formed by doping with beryllium or zinc. In a preferred embodiment of the present invention, where ion implantation is used to implant the dopants for the n- and p-type regions, a sufficient amount of dopant is implanted so that the resultant p- and n-type regions each have a density of at least $10^{18}$ atoms of dopant/cm$^3$. In a preferred embodiment, the p- and n-type regions are formed of doped gallium arsenide.

In the superlattice structure, the thickness of the individual layers is preferably from about 20–40 nm. Preferably, the overall thickness of the superlattice is from about 1–2 $\mu$m. Preferably, the surface layer (last grown layer) of this device can be passivated by growing an aluminum gallium arsenide (AlGaAs) cap layer 23 on the top of the NIPI superlattice 9 and the p- and n-type regions, 17 and 15, respectively. This passivating aluminum gallium arsenide layer 23 is preferably at least 2500 Å thick.

Ohmic connections between suitable microstrip transmission lines, bias lines, and the contact regions can be made by conventional photolithography. Preferably, a microstrip is formed of a metal layer on the undoped semiconducting material. In a preferred embodiment, the metal microstrip layer is gold or copper or any other suitable conductor. The microstrip transmission lines 21 and 19 are respectively connected electrically to the p- and n-type regions, 17 and 15.

Thin chromium layers 25 and 27 are preferably formed between the respective microstrip transmission lines 19 and 21 and the semiconducting material 5 to improve adhesion therebetween. Preferably, each of the microstrip transmission lines 19 and 21 is at least about 2 $\mu$m in thickness. It is preferred that the microstrip transmission lines 19 and 21 and ground plane 3 each have a thickness of at least 4 skin depths to prevent excessive loss of microwave energy. The skin depth is the characteristic length to which a microwave field penetrates into a conductor, and the determination of skin depth at any operating frequency can be determined by routine experimentation.

Various interface and buffer layers preferably can be grown before the NPNP alternately doped layers in addition to the aluminum gallium arsenide layer in order to further reduce the degradation in switch performance due to surface recombination.

The interface and buffer layers may be grown by any suitable single crystal growth technology which provides sharp interfaces and well-defined doping variations. Although molecular beam epitaxy is the most desirable choice, in many applications, chemical vapor deposition, where applicable, can also be used. Preferably, the technique of improving the on-state resistance of a microwave switching diode by replacing the intrinsic region of the diode with a NIPI layered, fully compensated, fully depleted region can be applied to devices fabricated for other direct-gap semiconductors such as indium phosphide or indium gallium arsenide.

It should, therefore, readily be understood that many modifications and variations of the present invention are possible within the purview of the claimed invention. It is, therefore, to be understood that, within the scope of the appended claims, the invention may be practiced otherwise than as specifically described.

WHAT IS CLAIMED AND DESIRED TO BE SECURED BY LETTERS PATENT OF THE UNITED STATES IS:

1. A microwave switch for controlling the transmission of microwave energy in a microstrip structure, said microwave switch comprising:
   a planar electrically conducting ground plane;
   an undoped semiconducting material in contact with said ground plane;
   a plurality of epitaxially grown layers of a semiconducting material disposed on said undoped semiconducting material, said plurality of epitaxially grown layers being alternately doped with different dopants to form interleaved p- and n-type layers, the thickness of said grown layers and the amount of dopants contained in said grown layers being balanced to provide a superlattice which is fully compensated and is fully depleted of free-charge carriers;
   p- and n-regions formed integral with said superlattice so that said superlattice electrically connects said p- and n-regions; and
   first and second microstrip transmission lines electrically connected to said p- and n-regions, respectively.

2. The microwave switch of claim 1 wherein:
said ground plane is a metallic layer.

3. The microwave switch of claim 2 wherein:
said metallic layer comprises gold or copper.

4. The microwave switch of claim 2 further including:
   a film layer of chromium disposed between said conducting ground plane and said undoped semiconducting material.

5. The microwave switch of claim 1 wherein:
said undoped semiconducting material is undoped gallium arsenide.

6. The microwave switch of claim 1 wherein:
said superlattice is formed of a periodic sequence of p- and n-doped gallium arsenide layers.

7. The microwave switch of claim 6 wherein:
the dopant in said n-region is selected from the group consisting of silicon and tin; and
the dopant in said p-region is selected from the group consisting of beryllium and zinc.

8. The microwave switch of claim 1 wherein:
the density of the dopant in said n-region is at least $10^{+18}$ atoms of dopant/cm$^3$.

9. The microwave switch of claim 1 wherein:
the density of the dopant in said p-region is at least $10^{+18}$ atoms of dopant/cm$^3$.

10. The microwave switch of claim 1 wherein:
the thickness of each of the individual layers of said superlattice is from about 20–40 nm.

11. The microwave switch of claim 1 wherein:
said superlattice is from about 1–2 $\mu$m in thickness.

12. The microwave switch of claim 1 wherein:
in said superlattice the product of the thickness of an n-type layer and its associated dopant concentration therein substantially equals the product of the thickness of a p-type layer and its associated dopant concentration therein.

13. The microwave switch of claim 1 wherein:
the p-and n-regions are comprised of doped gallium arsenide.

14. The microwave switch of claim 13 wherein:
said n- region is doped with silicon or tin; and
said p-region is doped with beryllium or zinc.

15. The microwave switch of claim 17 wherein:
said aluminum gallium arsenide layer is at least 2500 Å thick.

16. The microwave switch of claim 1 further including:
   a passivating layer disposed on said superlattice for inhibiting surface recombination.

17. The microwave switch of claim 16 wherein:
said passivating layer is comprised of aluminum gallium arsenide.

18. The microwave switch of claim 1 wherein:
each of said first and second microstrip transmission lines is a metal layer formed on said undoped semiconducting material.

19. The microwave switch of claim 18 wherein:
said metal layer is comprised of gold or copper.

20. The microwave switch of claim 18 further including: first and second chromium layers disposed between respective ones of said first and second microstrip transmission lines and said undoped semiconducting material.

21. The microwave switch of claim 18 wherein:
each of said first and second transmission lines is at least about 2 $\mu$m in thickness.

22. The microwave switch of claim 18 wherein:
each of said first and second microstrip transmission lines and said ground plane has a thickness of at least 4 skin depths to prevent excessive loss of microwave energy.

* * * * *